(12) United States Patent
Miller et al.

(10) Patent No.: US 9,059,356 B1
(45) Date of Patent: Jun. 16, 2015

(54) LATERALLY INJECTED LIGHT-EMITTING DIODE AND LASER DIODE

(71) Applicant: Sandia Corporation, Albuquerque, NM (US)

(72) Inventors: Mary A. Miller, Albuquerque, NM (US); Mary H. Crawford, Albuquerque, NM (US); Andrew A. Allerman, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/549,233

(22) Filed: Nov. 20, 2014

Related U.S. Application Data

(60) Provisional application No. 61/907,814, filed on Nov. 22, 2013.

(51) Int. Cl.
| | |
|---|---|
| *H01L 29/06* | (2006.01) |
| *H01L 33/06* | (2010.01) |
| *H01L 33/24* | (2010.01) |
| *H01L 33/32* | (2010.01) |
| *H01L 33/38* | (2010.01) |
| *H01S 5/343* | (2006.01) |
| *H01S 5/042* | (2006.01) |
| *H01S 5/22* | (2006.01) |

(52) U.S. Cl.
CPC ................ *H01L 33/06* (2013.01); *H01L 33/24* (2013.01); *H01L 33/32* (2013.01); *H01L 33/38* (2013.01); *H01S 5/34333* (2013.01); *H01S 5/0425* (2013.01); *H01S 5/22* (2013.01)

(58) Field of Classification Search
CPC . H01L 51/56; H01L 51/0067; H01L 51/5016; H01L 21/32136; H01L 21/44; H01L 21/78; H01L 22/26; H01L 25/167; H01L 27/3244; H01L 27/3246; H01L 27/3248; H01L 27/3258; H01L 2933/0025
USPC ............ 257/18, 20, 28, 98, E33.01, E33.069, 257/E21.04; 438/22
See application file for complete search history.

(56) References Cited

U.S. PATENT DOCUMENTS

| | | | | |
|---|---|---|---|---|
| 4,792,958 | A * | 12/1988 | Ohba et al. | 372/45.01 |
| 6,044,098 | A * | 3/2000 | Sun | 372/46.013 |
| 7,612,366 | B2 * | 11/2009 | Mears et al. | 257/20 |
| 2012/0043527 | A1 * | 2/2012 | Ding et al. | 257/28 |
| 2013/0033743 | A1 * | 2/2013 | Robertson et al. | 359/344 |
| 2014/0231841 | A1 * | 8/2014 | Wang | 257/98 |

* cited by examiner

*Primary Examiner* — Mark A Laurenzi
(74) *Attorney, Agent, or Firm* — Kevin W. Bieg

(57) ABSTRACT

A p-type superlattice is used to laterally inject holes into an III-nitride multiple quantum well active layer, enabling efficient light extraction from the active area. Laterally-injected light-emitting diodes and laser diodes can enable brighter, more efficient devices that impact a wide range of wavelengths and applications. For UV wavelengths, applications include fluorescence-based biological sensing, epoxy curing, and water purification. For visible devices, applications include solid state lighting and projection systems.

25 Claims, 4 Drawing Sheets

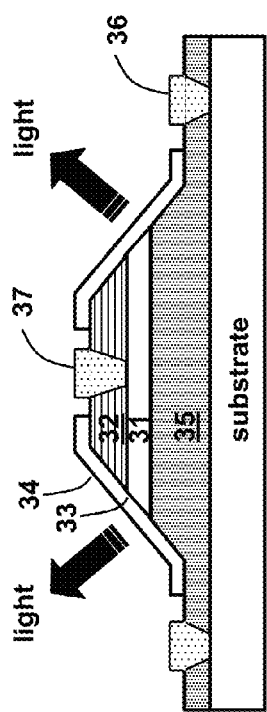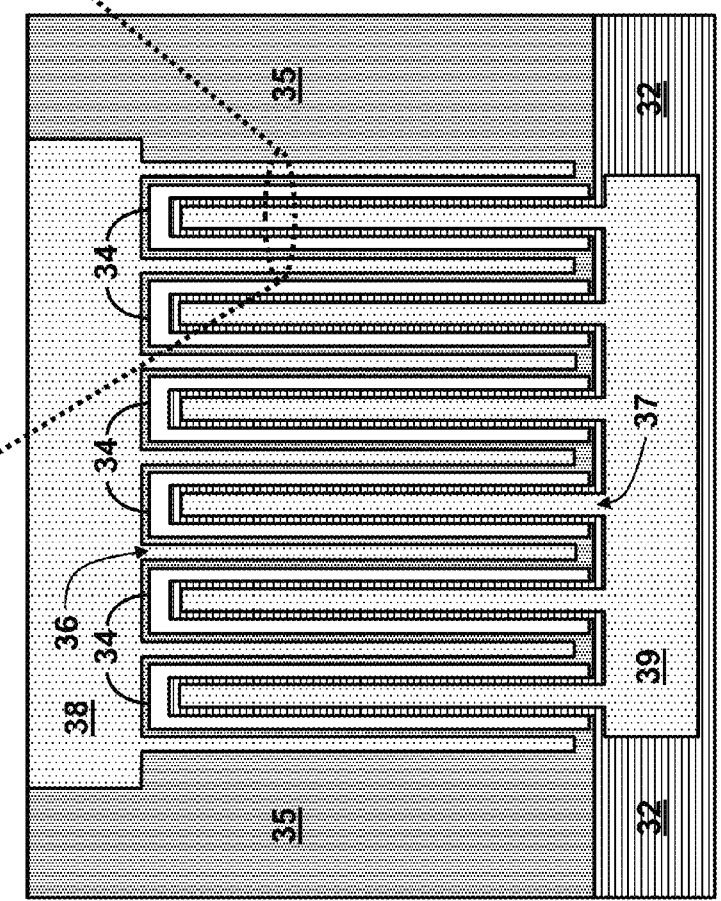
FIG. 3B
FIG. 3A

LATERALLY INJECTED LIGHT-EMITTING DIODE AND LASER DIODE

CROSS-REFERENCE TO RELATED APPLICATION

This application claims the benefit of U.S. Provisional Application No. 61/907,814, filed Nov. 22, 2013, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to light-emitting diodes (LEDs) and laser diodes (LDs) and, in particular, to laterally-injected LEDs and LDs for deep ultraviolet (UV) and visible applications.

BACKGROUND OF THE INVENTION

Some of the roadblocks that have limited successful commercialization of deep UV devices are high dislocation densities, nonradiative defects and, particularly, low hole concentrations and poor hole injection. Large activation energies and, therefore, poor efficiency of the Mg acceptor in GaN and AlGaN has delayed maturity of these devices. The resistivities of bulk p-GaN and p-$Al_xGa_{1-x}N$ are high. Activation energy of Mg dopants and concentration of compensating defects also increase with x in $Al_xGa_{1-x}N$, presenting a challenge for the growth of low resistance material for shorter wavelength applications. LEDs often employ a p-GaN capping layer as a less resistive contact layer, but at the expense of severe optical absorption losses at UV wavelengths. The removal of the p-GaN capping layer and significant improvement in p-type doping and hole injection will need to be achieved in order to realize high performance deep UV devices.

Superlattices (SLs) comprise two semiconductor materials with different band gaps which are deposited alternately on each other to form a periodic structure in the growth direction. Recently, SLs have been investigated as replacements for bulk $Al_xGa_{1-x}N$ to increase the hole concentration within the p-type layer. Spontaneous polarization is inherent in the nitride materials grown in the (0001) direction due to their wurtzite crystal structure. This allows unique device structures to be developed. Power devices such as high electron mobility transistors (HEMTs) have relied upon the AlGaN/GaN heterostructure which forms a two-dimensional electron gas (2DEG) at the interface. The 2DEG is a thin, highly conductive, lateral channel from which HEMTs can greatly benefit. Superlattices of alternating p-type nitride layers enjoy a similar carrier accumulation at the interfaces, producing parallel sheets where band bending increases the ionization of acceptors and therefore increases the concentration of holes, forming a two-dimensional hole gas (2DHG). See P. Kozodoy et al., *Appl. Phys. Lett.* 74, 3681 (1999); E. F. Schubert et al., *Appl. Phys. Lett.* 69, 3737 (1996); and K. Kumakura et al., *Jpn. J. Appl. Phys.* 39, 2428 (2000).

Superlattice structures have been integrated into GaN-based LEDs and LDs to replace the bulk p-type AlGaN with some success. See S.-N. Lee et al., *J. Cryst. Growth* 287, 554 (2006); S. A. Nikishin et al., *Jpn. J. Appl. Phys.* 42, L1362 (2003); T. Nishida et al., *Jpn. J. Appl. Phys.* 42, 2273 (2003); and S. A. Nikishin et al., *Jpn. J. Appl. Phys.* 44, 7221 (2005). Measured resistivities of these p-type SLs are similar to that of p-GaN layers, but the Hall measurement only determines lateral resistivity. See P. Kozodoy et al., *Appl. Phys. Lett.* 74, 3681 (1999); and S. A. Nikishin et al., *Jpn. J. Appl. Phys.* 42, L1362 (2003). The measured or estimated vertical resistivity of various p-SL stacks is typically greater than the horizontal resistivity. See S. A. Nikishin et al., *Jpn. J. Appl. Phys.* 42, L1362 (2003); C. Y. Hu et al., *J. Cryst. Growth* 298, 815 (2007); and M. Z. Kauser et al., *Mater. Res. Soc. Symp. Proc.* 831, E3.39.1 (2005). Although development of p-type SLs has increased the spatial carrier concentration compared to bulk p-type material, there is still a high vertical resistivity to overcome suggesting that the conventional vertical LED or LD design may be limiting forward progress in this area.

A number of groups have reported lateral LEDs and LDs in III-V systems other than nitrides. See V. Ryzhii et al., *J. Appl. Phys.* 90, 2654 (2001); V. Ryzhii et al., *J. Appl. Phys.* 92, 4459 (2002); S. M. Komirenko et al., *Solid-State Electron.* 47, 169 (2003); M. Cecchini et al., *Appl. Phys. Lett.* 82, 636 (2003); A. North et al., *IEEE J. Quantum Electron* 35, 352 (1999); E. H. Sargent, *Solid-State Electron.* 44, 147 (2000); and U.S. Pat. No. 5,563,902. Other groups have reported the use of a p-SL structure in a nitride LED or LD, but their designs still employ a vertically injected p-i-n structure where current flow is perpendicular to the layers in the superlattice. See M. Shatalov et al., *Applied Physics Express* 5 082101 (2012), S.-N. Lee et al., *J. Cryst. Growth* 287, 554 (2006); S. A. Nikishin et al., *Jpn. J. Appl. Phys.* 42, L1362 (2003); T. Nishida et al., *Jpn. J. Appl. Phys.* 42, 2273 (2003); G. Kipshidze et al., *J. Appl. Phys.* 93, 1363 (2003); T. Nishida et al., *Appl. Phys. Lett.* 78, 399 (2001); S. Nakamura et al., *Appl. Phys. Lett.* 76, 22 (2000); S. Nakamura et al., *Appl. Phys. Lett.* 72, 211 (1998); and S-N. Lee et al., *Appl. Phys. Lett.* 88, 111101 (2006).

Therefore, a need remains for a laterally-injected III-nitride LED or LD having a p-SL hole injection region.

SUMMARY OF THE INVENTION

The present invention is directed to a laterally-injected light-emitting device, comprising a p-type superlattice layer have a slanted end facet for laterally injecting holes into an III-nitride multiple quantum well active layer deposited on the slanted end facet, and an n-type layer for injecting electrons into the III-nitride multiple quantum well active layer, thereby generating light emission from the active layer when the electrons and holes combine. In general, the invention applies to AlGaInN alloy systems, comprising one or more Group III element, such as aluminum, gallium, or indium, and nitrogen. The p-type superlattice has a spatially modulated chemical composition that enables high lateral hole conductivity. For example, the p-type superlattice can comprise p-type $Al_xGa_{1-x}N$ and p-type $Al_yGa_{1-y}N$, where compositions x and y are different, and material compositions can range from GaN to AlN. The p-type dopant preferably comprises Mg. The slanted end facet makes a shallow angle (e.g., less than 30 degrees) to the plane of the p-type superlattice, thereby enabling lateral hole injection into and efficient light extraction from the active region. The device can comprise an interdigitated array structure that greatly increases the total emitting area out of the top of the device. Alternatively, the p-type superlattice can be grown adjacent to a mesa encompassing a multi-quantum well active region to enable lateral hole injection. A low-refractive-index dielectric cladding layer can be deposited on at least one of the top and bottom of the mesa to provide increased mode confinement in an edge-emitting waveguide structure. Alternatively, a high reflectivity coating can be deposited on the top or the bottom of the mesa to provide a vertical-emitting structure.

BRIEF DESCRIPTION OF THE DRAWINGS

The detailed description will refer to the following drawings, wherein like elements are referred to by like numbers.

FIG. 3A is a top-view schematic illustration of an interdigitated laterally-injected light-emitting device. FIG. 3B is a cross-sectional schematic illustration of the ridge structure of the interdigitated laterally-injected light-emitting device.

DETAILED DESCRIPTION OF THE INVENTION

An embodiment of the present invention comprises a p-type SL to laterally inject holes into the QWs of a III-nitride LED or LD, thereby increasing hole injection efficiency. In particular, the invention takes advantage of two recent research results: (1) high lateral conductivity in p-type AlGaN-based short-period superlattices with average aluminum compositions covering a wide composition range, including 60% Al suitable for 280 nm and longer wavelength devices, and (2) the demonstration of an effective combined plasma and crystallographic chemical etch for yielding ultrasmooth facets in AlGaN. See M. A. Miller et al., *J. Electron. Mater.* 38, 533 (2009). The inventive devices utilize the high carrier concentration of the 2DHG in between SL layers by injecting holes in the direction parallel to the layers of the superlattice. Quantum wells interface the SL on its edge, providing numerous low potential barrier access points for current flow. These devices, described in the following two examples, have many advantages. The examples use AlGaN-based active and injection layers, although the invention is generally applicable to all AlGaInN alloy systems (i.e., systems comprising GaN, AlN, AlGaN, InN, InGaN, and/or AlInGaN). Therefore, rather than a AlGaN/AlGaN SL, InGaN/GaN, InGaN/AlGaN, or AlInGaN/AlGaInN SLs can also be used. Further, the following examples use Mg as a preferred dopant for the p-type SL, but other acceptors, such as C, Be, Cd, or Zn, can also be used.

Figure 1:
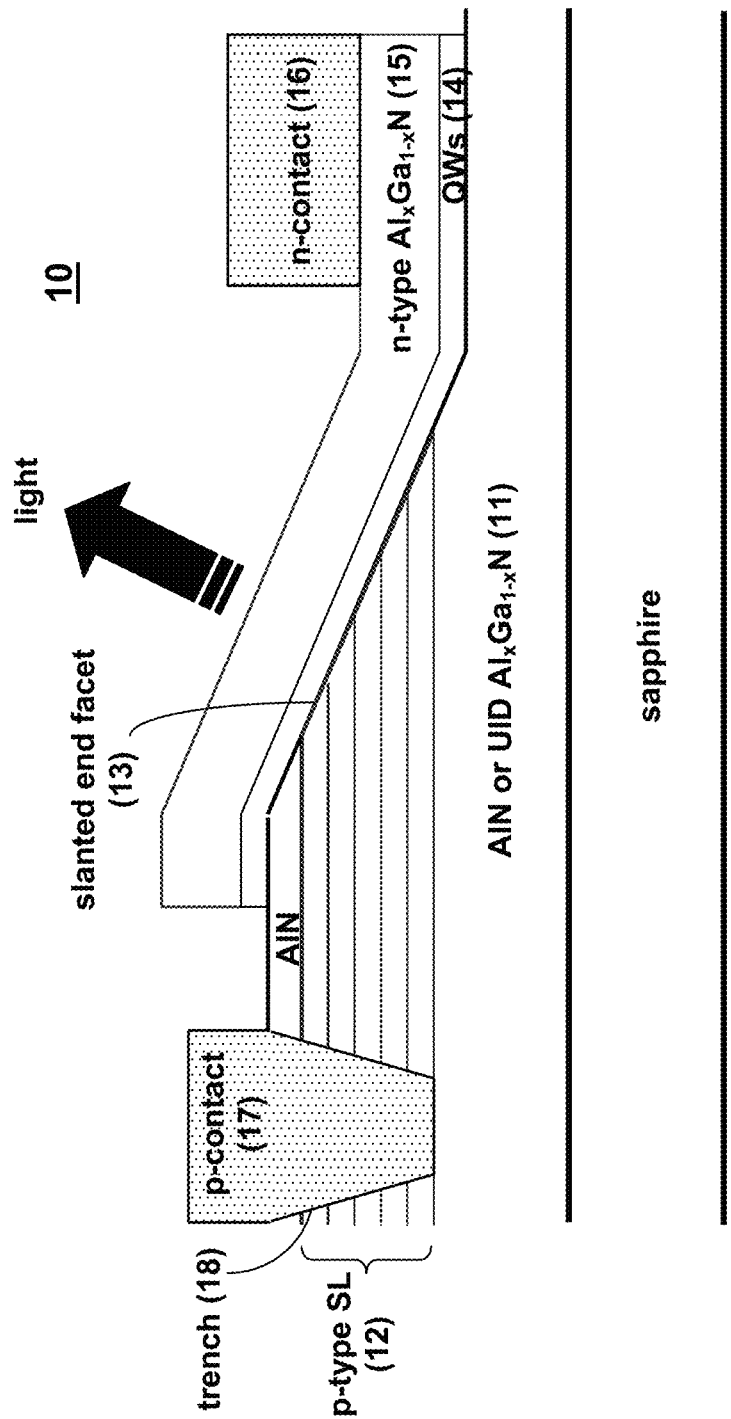
FIG. 1 is an end-view schematic illustration of a laterally-injected LED heterostructure comprising a p-type superlattice (SL) for laterally injecting holes into a multiple quantum well (MQW) active layer grown on the slanted end facet of the p-type SL and an n-type AlGaN grown on top of the MQW active layer.

A cross-sectional end-view schematic illustration of the first exemplary device 10 is shown in FIG. 1. In this device, the fabrication process begins with the growth of the p-type SL 12 on a large band gap insulator 11, such as AlN or unintentionally-doped (UID) $Al_xGa_{1-x}N$. The p-type SL 12 can comprise p-doped AlGaN with a spatially-modulated chemical composition that enables high lateral hole conductivity. For example, the p-type SL can comprise p-type $Al_xGa_{1-x}N$ and p-type $Al_yGa_{1-y}N$, where compositions x and y are different, and material compositions can range from GaN to AlN. For example, the AlGaN superlattice can be p-doped with Mg acceptor. A trench can be formed in the layered structure by plasma etching with a very low RF power. A mask, which can be a reflowed resist, can shape a very shallow sidewall of the trench (oriented ~20-30° from c-plane). The shallow sidewall can then treated with a KOH-based crystallographic wet etch to allow the (10$\bar{1}$3) plane to emerge. The wet etch removes much of the plasma-damaged material and cleans up the sidewall to provide a slanted end facet 13 for the next step. The surface can be patterned with an oxide mask to prevent growth over the unetched portion of the p-type region 12, allowing for subsequent p-type metallization. A multiple quantum well (MQW) active layer 14 and an n-type layer (e.g., n-type AlGaN) 15 can be grown on top of this oxide-patterned structure. In both LED and LD structures, a higher bandgap AlGaN electron block layer can be grown as a thin layer right before the QWs to reduce electron leakage out of the QW region. Lastly, electrical contacts 16 and 17 can be made to the n- and p-type layers 15 and 12. The contact 17 to the p-SL 12 can be deposited after a trench 18 is etched into the p-SL 12 in order to maximize the thickness of p-SL contributing to lateral conduction. The potential barrier at the metal/semiconductor interface is predicted to decrease because of the potential for carrier tunneling from the metal to the 2DHGs. See Y.-J. Lin, *Jpn. J. Appl. Phys.* 45, L86 (2006). This eliminates the need to use p-GaN as a contact layer.

Figure 2:
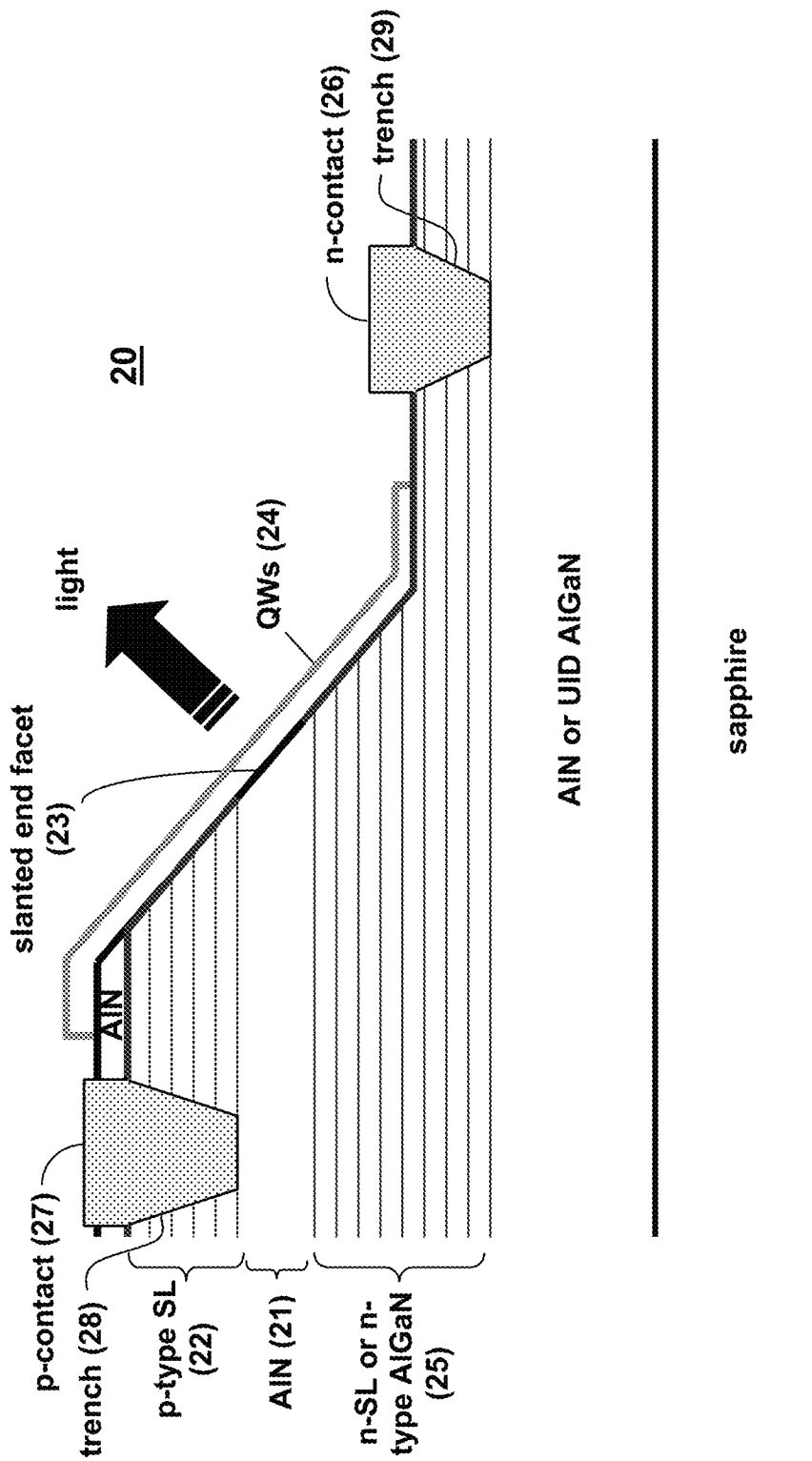
FIG. 2 is an end-view schematic illustration of a laterally-injected LED heterostructure with an n-type AlGaN layer grown before the p-type SL layer for laterally injecting electrons and holes into the MQW active layer.

The second example 20, shown in FIG. 2, has a different growth structure. In this case the n-type material 25 is grown first, followed by an insulating UID or AlN layer 21 and the p-type SL 22. (Alternatively, the p-type SL can be grown first, followed by the insulating layer, and the n-type layer on top of the insulating layer. However, with this structure, growth conditions would need to be controlled to avoid Mg dopant diffusion during subsequent growth of the n-type layer.) The same type of trench with shallow sidewalls can be formed by ICP etching followed by a crystallographic etch to remove residual damage. The MQW active layers 24 are grown on top of the slanted end facet 23, in this case providing efficient lateral injection of holes from the 2DHG of the p-type SL 22 and electrons from the 2DEG of an n-type SL (if a SL is used for the n-type side 25 of the device) or alternatively, from a bulk n-type AlGaN epilayer. Preferably, the separation of the injection layers 22 and 25 does not substantially exceed the diffusion lengths of either electrons or holes in the MQW layer 24 so that the electrons and holes overlap spatially to combine and emit photons. As noted for the previous example, electrical contacts 27 and 26 to the SLs 22 and 25 can have trenches 28 and 29 etched into the frontside of the p-type and n-type layers prior to metal deposition. Alternatively, electrical contact to the n-type layer 25 can be made through the bottomside. The key principle inherent in both exemplary devices is the utilization of 2DHGs, in the form of a single sheet or multiple sheets (p-SLs), to laterally inject holes into the QWs of the device.

The vertical length scale in these devices is small, on the order of 1-2 μm. Therefore, unless the trenches are grown very long, the emission area will be small. An interdigitated device 30, as shown in FIG. 3A can be used to increase the emission area. Similar to the structure of exemplary device 20, a layer of n-type material 35 can be grown first on an insulating substrate, followed by the UID $Al_xGa_xN$ or AlN layer 31, followed by the p-type SL layer 32. A series of longitudinal trenches can be formed in this multi-layer structure by ICP etching followed by a crystallographic wet etch to remove residual damage, thereby forming a series of parallel isosceles trapezoidal ridges. The sidewalls of the ridges are preferably at a shallow angle to the plane of the n- and p-type layers. The MQW active layer 34 is grown on the etched sidewalls, or slanted end facet 33, of each ridge. Therefore, each sidewall represents an emission area, as shown in the cross-sectional view in FIG. 3B. Interdigitated finger electrode n- and p-contacts 36 and 37 can then be made to the bottom n-type layer 35 and the top p-type SL 32, respectively. The finger contacts 36 to the n-type material 35 in each trench can be connected to a large bond pad 38 set apart from the QWs 34. A similar bond pad 39 can be used for the finger contacts 37 to the p-SLs 32 on the top of each trapezoidal ridge in an opposing orientation. This interdigitated array structure greatly increases the total emitting area out of the top of the device.

Alternative interdigitated array structures are also possible. For example, the p-type layer can be grown first, followed by the insulating layer, with the n-type layer on top. Alternatively, a structure similar to exemplary device 10 can be used, wherein the n-type layer is grown on top of the MQW active layer. Finally, alternative electrode configurations are also possible that do not require an interdigitated structure. For example, a conductive substrate (e.g., SiC or GaN) can be used with a planar backside n-contact can be made to the bottom n-type layer 35. Alternatively, if the n-type layer is disposed on top to the p-type superlattice layer, a backside p-contact can be made to the p-type superlattice layer.

The lateral injection structure of the present invention has several advantages over conventional vertical LED structures. Utilizing lateral conductivity of the p-type SL allows increased hole injection and carrier concentration. Contacts to the end facet of the superlattice do not require the use of p-GaN as a capping layer and therefore optical absorption from this lower bandgap material is prevented. Emission occurs through the top of the device and both contacts are displaced from this emission site which decreases absorption losses due to metals. In conventional vertical LED and LD structures, contacts have to be made to plasma-etched n-type $Al_xGa_{1-x}N$ (for UV devices) which can result in higher contact resistances. The first exemplary device, shown in FIG. 1, eliminates the necessity of etching the high Al fraction $Al_xGa_{1-x}N$ and therefore contact resistance to the n-type material will be lower in comparison. Finally, for both exemplary devices, the QWs can be grown upon the semipolar (10 $\bar{1}$3) plane which lessens internal polarization fields in the QWs, thereby enabling increased radiative efficiency.

Additional designs employing p-SLs are particularly attractive for overcoming the simultaneous challenges of effective hole injection and strong mode confinement in UV III-nitride LDs. III-nitride LDs developed to date employ a vertical p-n junction structure with n-type layers, QW active layers, and p-type layers deposited sequentially in the growth process. A fundamental characteristic of these prior designs is that high-bandgap cladding materials must simultaneously provide low-resistance carrier transport and sufficient refractive index contrast with the active layers to provide optical mode confinement. This condition presents an inherent conflict for AlGaN lasers because higher Al composition alloys that are required for lower refractive index have increasing acceptor activation energies and, therefore, are much more challenging to render p-type.

Figure 4:
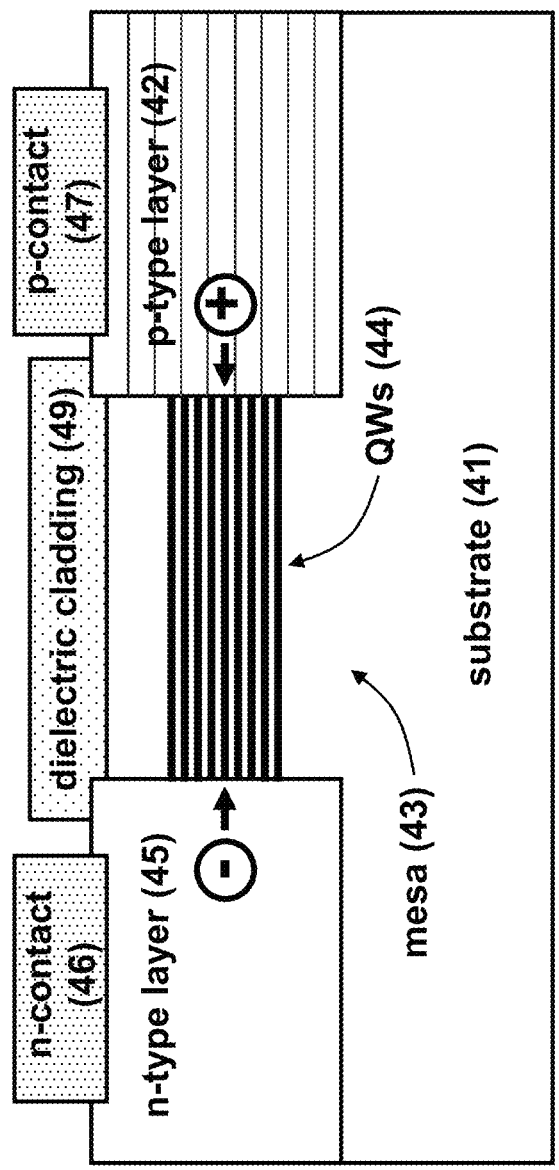
FIG. 4 is an end-view schematic illustration of a laterally-injected structure optimized for UV LDs, with additional benefits for visible and UV LEDs.

In FIG. 4 is shown a lateral-injection, edge-emitting laser design that decouples these requirements, providing both a mechanism for hole injection and low-loss mode confinement in a deep-UV laser structure. The exemplary device 40 uses two masked epitaxial regrowths to enable n-type and p-type injection layers 45 and 42 to be grown on either side of an etched mesa active region 43 on an insulating semiconductor substrate (e.g., AlN) 41. Preferably, the mesa 43 is not substantially wider than the carrier diffusion lengths to enable the electrons and holes to efficiently combine and emit photons. For UV LDs, the n-type material 45 can be n-AlGaN and the p-type material 42 can be a p-type $Al_xGa_{1-x}N/Al_yGa_{1-y}N$ SL that provide for lateral electron and hole injection in the plane of the QWs 44. Notably, the vertical dimension is not required for carrier transport and thus the mesa 43 can be a AlGaN laser heterostructure comprising a MQW active layer 44 embedded in a low-loss undoped (e.g., electrically insulating AlGaN) waveguide. A low-refractive-index dielectric overlayer or insulating AlN 49 can be used on the top and/or bottom of the mesa 43 for improved optical confinement. This design also allows for more uniform carrier injection into larger numbers of quantum wells than traditional vertical designs. This allows one to (1) compensate for the reduced gain of high Al composition AlGaN quantum wells, (2) reduce non-radiative (Auger) losses (proportional to the carrier density to the third power ($\sim n^3$)), given that sufficient gain can be realized with reduced carrier density in the individual wells, and (3) improve mode confinement, given that the quantum wells have higher refractive index than surrounding layers. In addition, high bandgap (AlN) barriers can be used for improved carrier confinement without carrier injection limitations. Finally, this design avoids the thick AlGaN cladding layers of typical vertically-injected LD designs and therefore results in a much thinner epitaxial structure, significantly reducing epitaxial growth times and mitigating problems of strain-relaxation and defect formation commonly seen with thick AlGaN layers grown on lattice-mismatched AlN or GaN substrates.

The lateral injection design depicted in FIG. 4 has additional, distinct benefits for InGaN-based visible LEDs. InGaN LEDs suffer a dramatic drop in efficiency at high currents, so-called "efficiency droop". This phenomenon is not due to device heating, as it is readily observed under pulsed operation. One hypothesis regarding the origin of efficiency droop is non-radiative loss through Auger recombination. See Y. C. Shen et al., *Appl. Phys. Lett.* 91, 141101-1 (2007). While Auger recombination is not typically dominant in wide bandgap semiconductors, it is hypothesized that large valence band offsets between quantum wells and barriers combined with polarization field effects inhibit effective hole distribution, leading to hole population of primarily only the first quantum well on the p-side of the device. See A. David et al., *Appl. Phys. Lett.* 92, 053502-1 (2008). This carrier build up in a single ultrathin quantum well may lead to high carrier densities even at fairly low currents, and therefore Auger recombination, with a dependence on carrier density to the third power (e.g., $\sim n^3$), may contribute significant nonradiative loss. In this way, the vertical injection of holes, and hole distribution in multi-quantum well structures, is also a problem for InGaN-based LEDs. However, a laterally-injected LED device enables uniform hole population of a much larger number of wells, greatly reducing the carrier density per well, and reducing related Auger recombination effects. For visible LED designs, the active region 44 can comprise an InGaN MQW LED structure and the p-type injection layer 42 can be p-GaN, in place of AlGaN p-SLs, given that GaN has shown sufficient p-type conductivity and is transparent for visible wavelengths.

A further benefit to this laterally-injected LED device is that a high reflectivity multi-layer dielectric coating or metal 49 can be deposited on top of the etched post active region 43 for ultra-low loss reflection of light in bottom-emitting flip-chip geometries (e.g., $HfO_2/SiO_2$ coatings are suitable for deep UV wavelengths and $TiO_2/SiO_2$ for visible, although other dielectric mirrors can be designed, depending on the specific reflectivity desired). For both AlGaN and InGaN-based flip-chip LEDs in the standard vertical geometry, the p-metal must serve both as a low resistivity electrical contact and a high reflectivity mirror—properties that are not simultaneously optimized for most metals and nitride materials. In contrast, many of the lateral LED devices allow for distinct materials to be used as a p-contact and a reflector, allowing for optimization of each material.

The present invention has been described as laterally-injected LEDs and LDs for deep UV and visible applications. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A laterally-injected light-emitting device, comprising:
   a p-type superlattice layer having a slanted end facet;
   an III-nitride multiple quantum well active layer deposited on the slanted end facet for laterally injecting holes from the p-type superlattice layer thereinto; and
   an n-type layer for injecting electrons into the III-nitride multiple quantum well active layer, thereby generating light emission from the active layer when the electrons and holes combine.

2. The laterally-injected light-emitting device of claim 1, wherein the p-type superlattice comprises alternating p-type $Al_xGa_{1-x}N$ and p-type $Al_yGa_{1-y}N$ layers, where x and y are different compositions.

3. The laterally-injected light-emitting device of claim 2, wherein the p-type superlattice layer is doped p-type with Mg acceptors.

4. The laterally-injected light-emitting device of claim 1, wherein the slanted end facet makes a shallow angle to the plane of the p-type superlattice layer.

5. The laterally-injected light-emitting device of claim 4, wherein the shallow angle is less than 30 degrees.

6. The laterally-injected light-emitting device of claim 1, wherein the n-type layer is deposited on the III-nitride multiple quantum well active layer.

7. The laterally-injected light-emitting device of claim 1, wherein the n-type layer is disposed above or below the p-type superlattice layer to laterally inject electrons into the III-nitride multiple quantum well active layer.

8. The laterally-injected light-emitting device of claim 1, wherein the n-type layer comprises n-type AlGaN.

9. The laterally-injected light-emitting device of claim 1, wherein the n-type layer comprises an n-type superlattice.

10. The laterally-injected light-emitting device of claim 1, further comprising a p-contact to the p-type superlattice layer and an n-contact to the n-type layer.

11. The laterally-injected light-emitting device of claim 10, wherein the p-contact or the n-contact is a backside contact.

12. The laterally-injected light-emitting device of claim 1, wherein the p-type superlattice layer and the n-type layer form at least one trapezoidal ridge structure and the III-nitride multiple quantum well active layer is deposited on sidewalls of the at least one trapezoidal ridge structure.

13. The laterally-injected light-emitting device of claim 12, wherein the p-type superlattice layer is disposed on top of the n-type layer in each of the ridge structures and wherein the device further comprises a finger electrode p-contact to the p-type superlattice layer at the top of each ridge and a finger electrode n-contact to the n-type layer at the bottom of each ridge.

14. The laterally-injected light emitting device of claim 13, wherein the device comprises a plurality of parallel trapezoidal ridge structures and wherein the plurality of finger electrode p-contacts and finger electrode n-contacts form an interdigitated structure.

15. The laterally-injected light-emitting device of claim 12, wherein the n-type layer is disposed on top of the p-type superlattice layer in each of the ridge structures and wherein the device further comprises a finger electrode n-contact to the n-type layer at the top of each ridge and a finger electrode p-contact to the p-type superlattice layer at the bottom of each ridge.

16. The laterally-injected light emitting device of claim 15, wherein the device comprises a plurality of parallel trapezoidal ridge structures and wherein the plurality of finger electrode p-contacts and finger electrode n-contacts form an interdigitated structure.

17. A laterally-injected light-emitting device, comprising;
    an III-nitride multiple quantum well active layer embedded laterally in a mesa heterostructure;
    an n-type layer on a side of the mesa that laterally injects electrons into the III-nitride multiple quantum well active layer; and
    a p-type layer on the opposing side of the mesa that laterally injects holes into the III-nitride multiple quantum well active layer, thereby generating light emission from the active layer when the electrons and holes combine.

18. The laterally-injected light-emitting device of claim 17, wherein the III-nitride multiple quantum well active region comprises AlGaN and the p-type layer comprises a p-type superlattice.

19. The laterally-injected light-emitting device of claim 18, wherein the p-type superlattice comprises alternating p-type $Al_xGa_{1-x}N$ and p-type $Al_yGa_{1-y}N$ layers, where x and y are different compositions.

20. The laterally-injected light-emitting device of claim 18, wherein the p-type layer is doped p-type with Mg acceptors.

21. The laterally-injected light-emitting device of claim 17, further comprising a low-refractive-index dielectric cladding layer on at least one of the top and bottom of the mesa to provide an edge-emitting waveguide structure.

22. The laterally-injected light-emitting device of claim 17, wherein the III-nitride multiple quantum well active region comprises InGaN and the p-type layer comprises p-type GaN.

23. The laterally-injected light-emitting device of claim 22, further comprising a high reflectivity coating on the top or the bottom of the mesa to provide a vertical-emitting structure.

24. The laterally-injected light-emitting device of claim 23, wherein the high reflectivity coating comprises a multi-layer dielectric coating or metal coating.

25. The laterally-injected light-emitting device of claim 24, wherein the multi-layer dielectric coating comprises $HfO_2/SiO_2$ or $TiO_2/SiO_2$.

* * * * *